United States Patent [19]
Gardner et al.

[11] Patent Number: 6,127,234
[45] Date of Patent: Oct. 3, 2000

[54] ULTRA SHALLOW EXTENSION FORMATION USING DISPOSABLE SPACERS

[75] Inventors: Mark I. Gardner, Cedar Creek; Frederick N. Hause, Austin, both of Tex.; Charles E. May, Gresham, Oreg.

[73] Assignee: Advanced Micro Devices, Inc., Austin, Tex.

[21] Appl. No.: 09/226,881

[22] Filed: Jan. 7, 1999

[51] Int. Cl.⁷ .................................................. H01L 21/336
[52] U.S. Cl. ............................................. 438/303; 438/305
[58] Field of Search ................................... 438/303, 305, 438/151, 238, 231, 234; 257/344, 315

[56] References Cited

U.S. PATENT DOCUMENTS

| | | | |
|---|---|---|---|
| 4,855,246 | 8/1989 | Codella et al. | 437/41 |
| 5,324,683 | 6/1994 | Fitch et al. | 437/65 |
| 5,543,339 | 8/1996 | Roth et al. | 437/43 |
| 5,616,941 | 4/1997 | Roth et al. | 257/315 |
| 5,654,213 | 8/1997 | Choi et al. | 438/231 |
| 5,719,425 | 2/1998 | Akram et al. | 257/344 |
| 5,766,991 | 6/1998 | Chen | 438/231 |
| 5,804,856 | 9/1998 | Ju | 257/344 |
| 5,888,861 | 3/1999 | Chien et al. | 438/234 |
| 5,963,803 | 10/1999 | Dawson et al. | 438/231 |

*Primary Examiner*—Jey Tsai
*Assistant Examiner*—Walter L. Lindsay, Jr.
*Attorney, Agent, or Firm*—Williams, Morgan & Amerson, P.C.

[57] ABSTRACT

The present invention is directed to a method of forming ultra shallow extensions in a transistor and a device incorporating same. The method comprises forming a gate dielectric and a gate conductor above a surface of a semiconducting substrate and forming a first plurality of sidewall spacers adjacent the gate dielectric and the gate conductor. The method continues with implanting the substrate with a dopant material to form a plurality of doped regions in the substrate, heating the substrate to drive the dopant material towards the gate dielectric, and removing the first plurality of sidewall spacers. The method further comprises forming a second plurality of sidewall spacers adjacent the gate dielectric and the gate conductor, and performing a second ion implantation process to complete the formation of source/drain regions in said substrate. The present invention is also directed to a structure comprising a gate dielectric positioned above a surface of a semiconducting substrate, and a gate conductor positioned above the gate dielectric. The structure further comprises a plurality of sidewall spacers positioned adjacent the gate dielectric and the gate conductor, the sidewall spacers having a certain thickness. The structure further comprises a plurality of doped regions formed in the substrate that are laterally spaced apart from the gate dielectric by an amount corresponding to the approximate thickness of the sidewall spacers.

33 Claims, 3 Drawing Sheets

ULTRA SHALLOW EXTENSION FORMATION USING DISPOSABLE SPACERS

BACKGROUND OF THE INVENTION

1. Field of the Invention

The present invention is generally directed to the field of semiconductor processing, and, more particularly, to the formation of ultra shallow extensions in transistor devices.

2. Description of the Related Art

In attempting to increase the performance of modem transistor devices, all potential sources of performance degradation must be addressed. One such area of performance degradation in such devices is the parasitic capacitances that occur when the extensions of typical source/drain regions extend under the gate dielectric of modem devices. These parasitic capacitances must be charged and discharged during every on/off cycle of a typical transistor. While this charging and discharging of these capacitances occurs relatively rapidly, the charging and discharging does take a finite period of time, which acts to slow down the operation of the transistor.

By way of background, a typical field effect transistor is comprised of a gate dielectric positioned above a silicon substrate, a gate conductor positioned above the gate dielectric, and a plurality of source/drain regions that are self-aligned to the gate dielectric. The source/drain regions are typically created by one or more ion implantation processes in which the appropriate dopant material, e.g., arsenic for NMOS technology, is implanted into the silicon substrate. After this initial implantation process, the implanted region is subjected to a heating operation to activate the dopant, i.e., to realign the lattice structure such that the dopant atoms are substitutionally placed within the polysilicon and silicon structure. Typically, this heating process may be a rapid thermal anneal (RTA) process performed at a temperature of 950–1100° C. for a 5–20 seconds. This heat treating process causes an aniso-tropic spreading of the previously implanted dopant materials in the substrate, i.e., the dopant spreads under the gate as well as into the substrate. The spreading of the dopant material under the gate dielectric may create a parasitic capacitance that acts to degrade the performance of the transistor device.

The present invention is directed to a method and apparatus for solving, or at least reducing the effects of, some or all of the aforementioned problems.

SUMMARY OF THE INVENTION

The present invention is directed to a method of forming ultra shallow extensions in a transistor and a device incorporating same. The method comprises forming a gate dielectric and a gate conductor above a surface of a semiconducting substrate, and forming a first plurality of sidewall spacers adjacent the gate dielectric and the gate conductor. The method continues with implanting the substrate with a dopant material to form at least one doped region in the substrate, heating the substrate to drive the dopant material towards the gate dielectric, and removing the first plurality of sidewall spacers. The method further comprises forming a second plurality of sidewall spacers adjacent the gate dielectric and the gate conductor and performing a second ion implantation process to complete the formation of source/drain regions in said substrate.

The present invention is also directed to a particular structure comprising a gate dielectric positioned above a surface of a semiconducting substrate, and a gate conductor positioned above the gate dielectric. The structure further comprises a plurality of sidewall spacers positioned adjacent the gate dielectric and the gate conductor, the sidewall spacers having a certain thickness. The structure additionally comprises a plurality of doped regions formed in the substrate that are laterally spaced apart from the gate dielectric by an amount corresponding to the approximate thickness of the sidewall spacers.

BRIEF DESCRIPTION OF THE DRAWINGS

The invention may be understood by reference to the following description taken in conjunction with the accompanying drawings, in which like reference numerals identify like elements, and in which.

Figure 1:
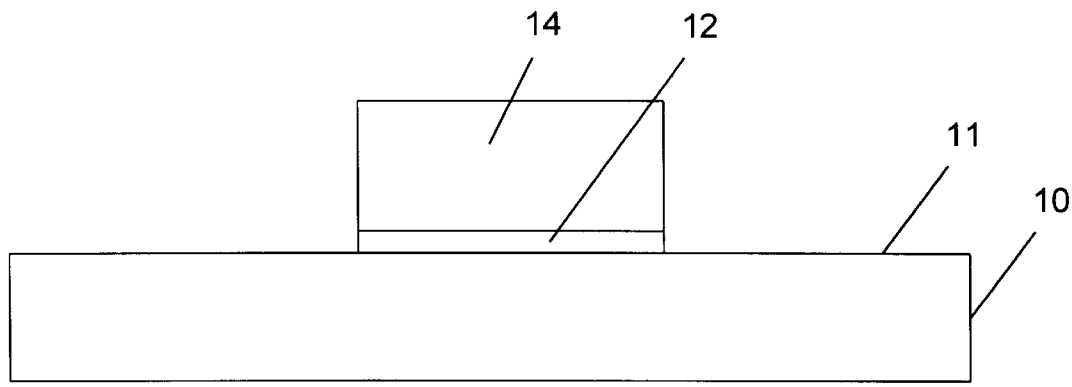
FIG. 1 is a cross-sectional view of an illustrative transistor comprised of a gate dielectric and a gate conductor.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 1–5. Although the various regions and structures of a semiconductor device are depicted in the drawings as having very precise and sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those feature sizes on fabricated devices. Nevertheless, the attached drawings are included to describe and explain illustrative examples of the present invention.

In general, the present invention is directed to a method of forming ultra shallow source/drain extensions using disposable spacers, and a structure incorporating the same. As will be readily apparent to those skilled in the art upon a complete reading of the present application, the present invention is applicable to a variety of technologies, e.g., NMOS, PMOS, CMOS, etc., and is readily applicable to a variety of devices, including, but not limited to, logic devices, memory devices, etc.

As depicted in FIG. 1, a partially formed transistor is comprised of a gate dielectric 12 formed above a surface 11 of a semiconducting substrate 10, and a gate conductor 14 formed above the gate dielectric 12. In one illustrative embodiment, the semiconducting substrate 10 is comprised of silicon. The gate dielectric 12 and the gate conductor 14 may be comprised of a variety of materials and formed by a variety of different techniques. Thus, the materials of construction, as well as their method of manufacture, should not be considered a limitation of the present invention.

For example, the gate dielectric 12 may be comprised of silicon dioxide, silicon oxynitride, silicon nitride, or other like materials, and may be formed by thermal growing, chemical vapor deposition (CVD), low pressure chemical vapor deposition (LPCVD), etc. The gate conductor 14 may be comprised of a doped polysilicon or a metal, such as, for example, aluminum or copper. As will be known to those skilled in the art, the gate dielectric 12 and the gate conductor 14 may be formed by the formation of the appropriate process layers and thereafter patterning those layers by, for example, etching, to form the gate dielectric 12 and the gate conductor 14 depicted in FIG. 1.

Figure 2:
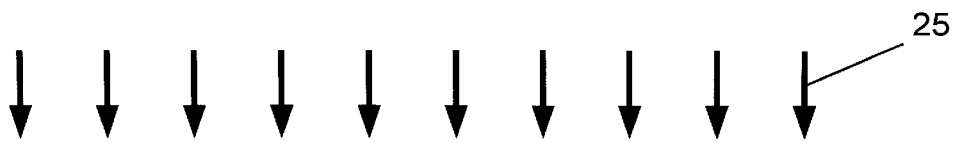
FIG. 2 is a cross-sectional view of the device shown in FIG. 1 after a process layer comprised of a disposable spacer material has been formed thereabove.
Figure 2:
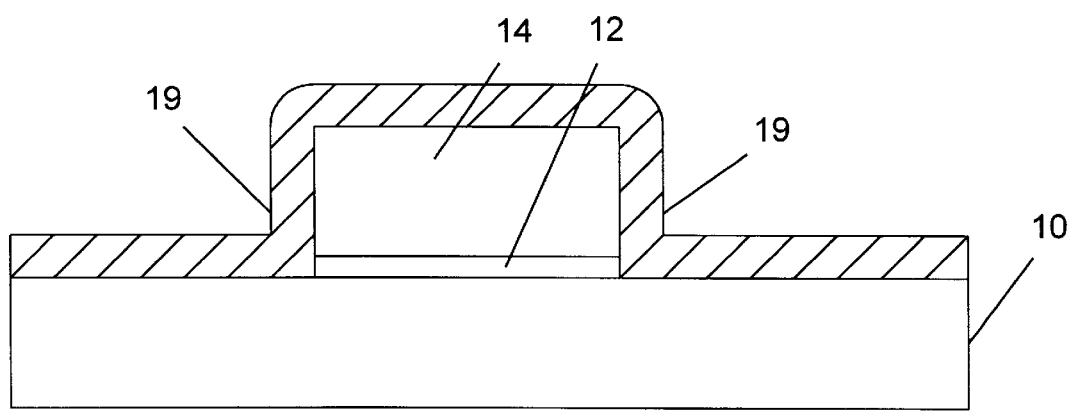

Next, as shown in FIG. 2, a process layer 19 comprised of a removable spacer material is formed above the structure shown in FIG. 1. The process layer 19 may be comprised of a variety of materials, such as, for example, silicon germanium (SiGe), germanium tetrahydrogen (GeH$_4$), or other like materials. The process layer 19 may be formed by a variety of processes, such as CVD, plasma enhanced chemical vapor deposition (PECVD), plasma deposition, or other like processes. Additionally, the process layer 19 may be formed to a variety of thicknesses. In one illustrative embodiment, the process layer 19 is comprised of a conformal deposition of silicon germanium having a germanium concentration greater than approximately 25%, and having a thickness ranging from approximately 150–400 Å. This germanium concentration may be added by an ion implantation process or during the initial formation of the process layer 19.

Additionally, an appropriate amount of dopant material (not shown) may be added to the process layer 19. The dopant material involved will vary depending upon the particular technology, e.g., arsenic for NMOS, boron for PMOS, etc. This dopant material may be added either through an ion implantation process after the process layer 19 is formed, or the dopant material may be added to the process layer 19 during the actual formation process, i.e., the dopant may be added in situ. An illustrative ion implantation process for adding dopant to the process layer 19 is depicted in FIG. 2 by the arrows 25. This implantation process may be performed at a dopant concentration ranging from approximately $4\times10^{15}$–$1\times10^{16}$ ions/cm$^2$ of the appropriate dopant material, e.g., arsenic for NMOS technology, and performed at an energy level ranging from approximately 2–10 keV. If the dopant material is added to the process layer 19 by an in situ process, a similar concentration of dopant materials would be added during the formation of the process layer 19.

Figure 3:
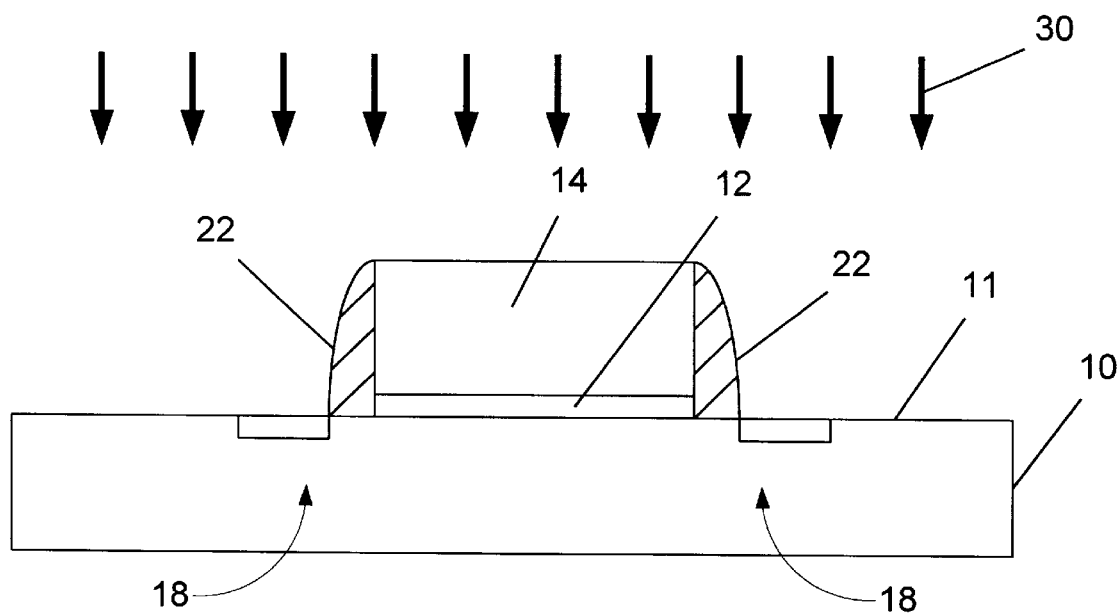
FIG. 3 is a cross-sectional view of the device shown in FIG. 2 after a plurality of sidewall spacers have been formed thereon.
Figure 4:
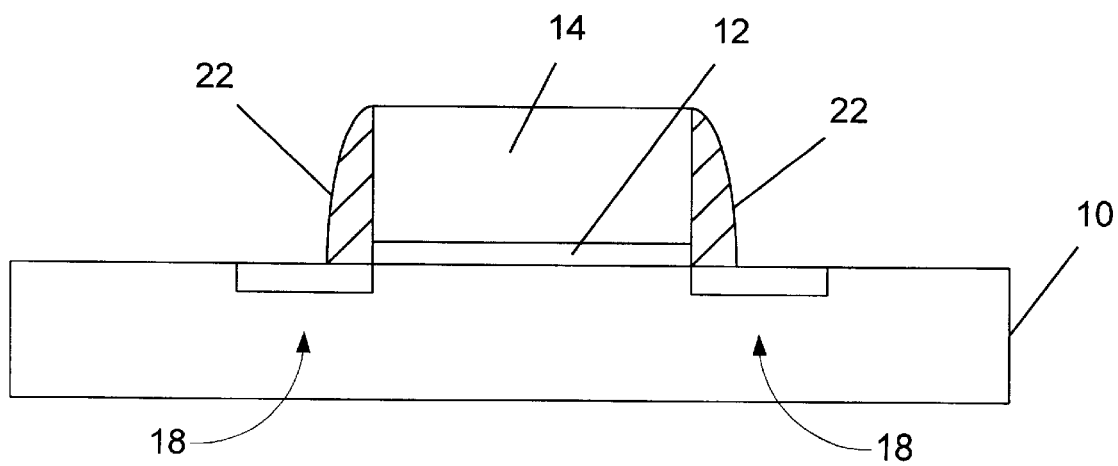
FIG. 4 is a cross-sectional view of the device shown in FIG. 3 after it has been subjected to a heating process.

Thereafter, as shown in FIG. 3, one or more etching processes are performed to define a plurality of disposable sidewall spacers 22 formed adjacent the gate conductor 14 and the gate dielectric 12. The etching process employed is typically an anisotropic etching process commonly used to form such spacers, and thus, the presently disclosed technique for etching the process layer 19 should not be considered a limitation of the present invention. The thickness of the sidewall spacers 22, as measured at the surface 11 of the substrate 10, may be varied as a matter of design choice. For one illustrative embodiment, the sidewall spacers 22 have a thickness that ranges from approximately 150–400 Å.

Next, as shown in FIG. 3, an ion implantation process, indicated by arrows 30, is performed to form a plurality of doped regions 18 in the substrate 10. The particular dopant material used will vary depending upon the technology involved, e.g., arsenic for NMOS technology, etc. Upon a complete reading of the present application, those skilled in the art will recognize that the doped regions 18 are typically the initial doped regions formed in traditional lightly doped (LDD) source/drain structures commonly employed in transistor fabrication. In one illustrative embodiment, this ion implantation process is performed at a dopant concentration of $4\times10^{15}$–$1.0\times10^{16}$ ions/cm$^2$ and at an energy level of approximately 2–10 keV. However, it should be noted that, using the present invention, the dopant added to the substrate for the completed source/drain regions may be provided by a single ion implantation process. For example, such a single step process would be at a concentration of approximately $5\times10^{15}$–$3.0\times10^{16}$ ions/cm$^2$, and at an energy level ranging from approximately 10–40 keV. Note that during the implantation process, the disposable sidewall spacers 22 acts as a mask to ensure that the doped regions 18 are laterally spaced apart from the gate dielectric 12 by an amount corresponding to the thickness of the sidewall spacers 22.

Thereafter, the device is subject to a heating process. In one illustrative embodiment, this heating process is performed by a rapid thermal anneal (RTA) process at a temperature ranging from approximately 950–1100° C. for a time period ranging from approximately 5–20 seconds. During this heating process, the doped regions 18 expand isotropically, i.e., the doped regions 18 are expanded in all directions. Compare FIG. 3, where the doped regions 18 are in their as-implanted configuration and location, i.e., outside of the sidewall spacers 22, to FIG. 4, where the doped regions 18 are approximately aligned with the gate dielectric 12. During this process, the disposable spacer material 22, which contains a quantity of dopant material, acts as a dopant source as the doped regions 18 expand toward the gate dielectric 12. Using the present technique, the amount by which the regions 18 extend under the gate dielectric 12 may be reduced or eliminated.

After the heating process described above, the disposable sidewall spacers 22 are removed. Preferably, the sidewall spacers 22 are comprised of a material that is readily removable. For example, in the case where the sidewall spacers 22 are comprised of silicon germanium, the sidewall spacers 22 may be removed by a wet cleaning process involving sulfuric acid ($H_2SO_4$), peroxide ($H_2O_2$) and water. This is commonly known in the industry as an "RCA" clean.

Figure 5:
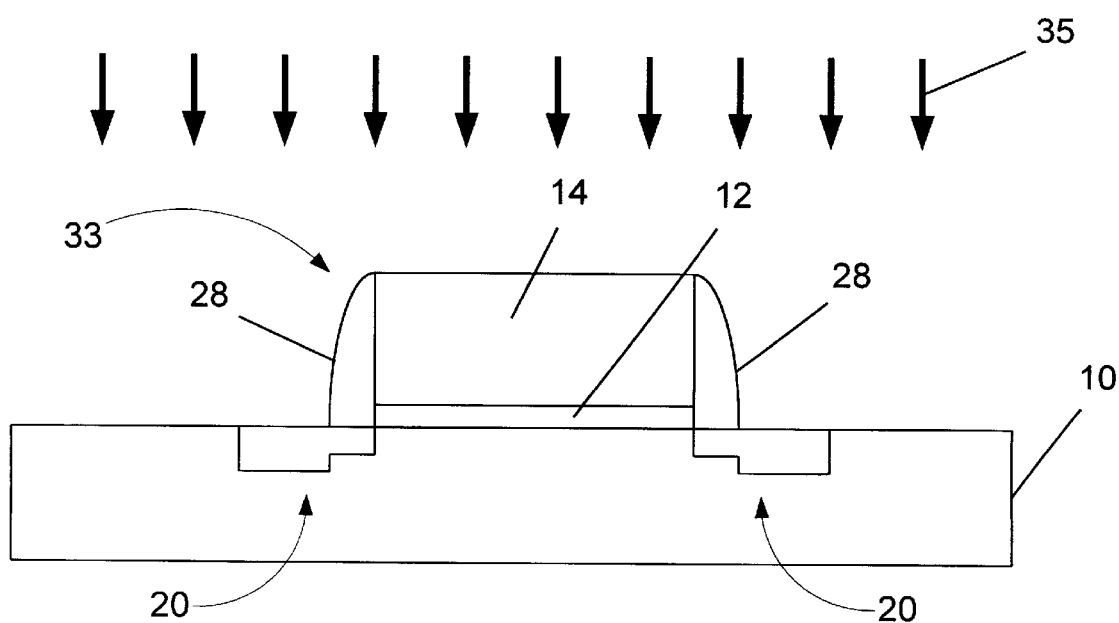
FIG. 5 is a cross-sectional view of the device shown in FIG. 4 after the disposable sidewall spacers have been removed and additional sidewall spacers have been formed thereon.

Next, as shown in FIG. 5, the remaining steps necessary to form a transistor 33 are performed using known processes and materials of construction. For example, a plurality of sidewall spacers 28 comprised of silicon dioxide or silicon oxynitride are formed adjacent the gate conductor 14 and the gate dielectric 12. The sidewall spacers 28 may be formed by the deposition of an appropriate layer of spacer material followed by one or more anisotropic etching processes to result in the sidewall spacers 28 shown in FIG. 5. Thereafter, the device is subjected to yet another ion implantation process to complete the formation of source/drain regions 20 depicted in FIG. 5. For example, this second ion implantation process may be performed at a dopant concentration ranging from approximately $2.0–8.0\times10^{15}$ ions/cm$^2$ and at an energy level of approximately 10–50 keV.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a transistor, comprising:
   forming a gate dielectric and a gate conductor above a surface of a semiconducting substrate;
   forming a first plurality of sidewall spacers adjacent said gate dielectric and said gate conductor;
   implanting said substrate with a dopant material to form a plurality of lightly-doped regions in said substrate adjacent said first plurality of sidewall spacers;
   heating said substrate to drive said dopant material in said lightly-doped regions toward said gate dielectric;
   removing said first plurality of sidewall spacers;
   forming a second plurality of sidewall spacers adjacent said gate dielectric and said gate conductor; and
   implanting said substrate with a dopant material to form a plurality of heavily-doped regions in said substrate in an area adjacent said second plurality of sidewall spacers said heavily-doped region having a higher concentration of dopant material than said lightly-doped regions.

2. The method of claim 1, wherein forming a gate dielectric and a gate conductor above a surface of a semiconducting substrate comprises:
   forming a layer of dielectric material above a surface of said substrate;
   forming a layer of gate conductor material above said layer of dielectric material; and
   patterning said layer of dielectric material and said layer of gate conductor material.

3. The method of claim 1, wherein forming a first plurality of sidewall spacers adjacent said gate dielectric and said gate conductor comprises forming a first plurality of sidewall spacers comprised of silicon germanium or germanium tetrahydrogen (GeH$_4$) adjacent said gate dielectric and said gate conductor.

4. The method of claim 1, wherein forming a first plurality of sidewall spacers adjacent said gate dielectric and said gate conductor comprises forming a first plurality of sidewall spacers comprised of silicon germanium having a germanium concentration of greater than approximately 25% adjacent said gate dielectric and said gate conductor.

5. The method of claim 1, wherein forming a first plurality of sidewall spacers adjacent said gate dielectric and said gate conductor comprises:
   forming a layer of spacer material at least above said gate conductor and said substrate;
   implanting said layer of spacer material with a quantity of dopant material; and
   anisotropically etching said layer of spacer material to form a first plurality of sidewall spacers comprised of said spacer material and said dopant material.

6. The method of claim 1, wherein forming a first plurality of sidewall spacers adjacent said gate dielectric and said gate conductor comprises:
   forming a layer of spacer material at least above said gate conductor and said substrate, said layer being formed in the presence of a dopant material; and
   anisotropically etching said layer of spacer material to form a first plurality of sidewall spacers comprised of said spacer material and said dopant material.

7. The method of claim 1, wherein implanting said substrate with a dopant material to form a plurality of lightly-doped regions in said substrate comprises implanting said substrate with a dopant material at a concentration ranging from approximately $4\times10^{15}141.0\times10^{16}$ ions/cm$^2$ and at an energy level ranging from approximately 2–10 keV to form a plurality of lightly-doped regions in said substrate adjacent said first plurality of sidewall spacers.

8. The method of claim 1, wherein heating said substrate to drive said dopant material toward said gate dielectric comprises heating said substrate to a temperature ranging from approximately 950–1100° C. to drive said dopant material toward said gate dielectric.

9. The method of claim 1, wherein removing said first plurality of sidewall spacers comprises performing a wet etching process.

10. The method of claim 1, wherein forming a second plurality of sidewall spacers adjacent said gate dielectric and said gate conductor comprises:
    forming a process layer comprised of a material for said second plurality of sidewall spacers; and
    anisotropically etching said process layer.

11. The method of claim 1, wherein implanting said substrate with a dopant material to form a plurality of heavily-doped regions in said substrate, comprises implanting said substrate at a dopant concentration ranging from approximately $5\times10^{15}143\times10^{16}$ ions/cm$^2$ and at an energy level ranging from approximately 10–40 keV to form a plurality of heavily-doped regions in said substrate.

12. The method of claim 1, wherein forming a first plurality of sidewall spacers adjacent said gate dielectric and said gate conductor comprises forming a first plurality of sidewall spacers having a thickness ranging from approximately 150–400 Å adjacent said gate dielectric and said gate conductor.

13. A method of forming a transistor, comprising:
    forming a gate dielectric and a gate conductor above a surface of a semiconducting substrate;
    forming a first plurality of sidewall spacers comprised of silicon germanium adjacent said gate dielectric and said gate conductor;
    implanting said substrate with a dopant material to form a plurality of lightly-doped regions in said substrate adjacent said first plurality of sidewall spacers;
    heating said substrate to drive said dopant material in said lightly-doped regions toward said gate dielectric;
    removing said first plurality of sidewall spacers;
    forming a second plurality of sidewall spacers adjacent said gate dielectric and said gate conductor; and
    implanting said substrate with a dopant material to form a plurality of heavily-doped regions in said substrate in an area adjacent said second plurality of sidewall spacers said heavily-doped regions having a higher concentration of dopant material than said lightly-doped regions.

14. The method of claim 13, wherein forming a gate dielectric and a gate conductor above a surface of a semiconducting substrate comprises:

forming a layer of silicon dioxide above a surface of said substrate;

forming a layer of polysilicon above said layer of silicon dioxide; and patterning said layer of silicon dioxide and said layer of polysilicon.

15. The method of claim 13, wherein forming a first plurality of sidewall spacers comprised of silicon germanium adjacent said gate dielectric and said gate conductor comprises forming a first plurality of sidewall spacers comprised of silicon germanium having a germanium concentration of greater than approximately 25% adjacent said gate dielectric and said gate conductor.

16. The method of claim 13, wherein forming a first plurality of sidewall spacers adjacent said gate dielectric and said gate conductor comprises:

forming a layer of silicon germanium at least above said gate conductor and said substrate;

implanting said layer of silicon germanium with a quantity of dopant material; and anisotropically etching said layer of silicon germanium to form a first plurality of sidewall spacers comprised of silicon germanium and said dopant material.

17. The method of claim 13, wherein forming a first plurality of sidewall spacers adjacent said gate dielectric and said gate conductor comprises:

forming a layer of silicon germanium at least above said gate conductor and said substrate, said layer being formed in the presence of a dopant material; and anisotropically etching said layer of silicon germanium to form a first plurality of sidewall spacers comprised of silicon germanium and said dopant material.

18. The method of claim 13, wherein implanting said substrate with a dopant material to form a plurality of lightly-doped regions in said substrate adjacent said first plurality of sidewall spacers comprises implanting said substrate with a dopant material at a concentration ranging from approximately $4\times10^{15}$–$1.0\times10^{16}$ ions/cm$^2$ and at an energy level ranging from approximately 2–10 keV to form a plurality of lightly-doped regions in said substrate adjacent said first plurality of sidewall spacers.

19. The method of claim 13, wherein heating said substrate to drive said dopant material toward said gate dielectric comprises heating said substrate to a temperature ranging from approximately 950–1100° C. to drive said dopant material toward said gate dielectric.

20. The method of claim 13, wherein removing said first plurality of sidewall spacers comprises performing a wet etching process.

21. The method of claim 13, wherein forming a second plurality of sidewall spacers adjacent said gate dielectric and said gate conductor comprises:

forming a process layer comprised of silicon dioxide, silicon nitride, or silicon oxynitride; and anisotropically etching said process layer.

22. The method of claim 13, wherein implanting said substrate with a dopant material to form a plurality of heavily-doped regions in said substrate in an area adjacent said second plurality of sidewall spacers comprises implanting said substrate with a dopant material at a dopant concentration ranging from approximately $5\times10^{15}$–$3\times10^{16}$ ions/cm$^2$ and at an energy level ranging from approximately 10–40 keV to form a plurality of heavily-doped regions in said substrate.

23. The method of claim 13, wherein forming a first plurality of sidewall spacers adjacent said gate dielectric and said gate conductor comprises forming a first plurality of sidewall spacers having a thickness ranging from approximately 150–400 Å adjacent said gate dielectric and said gate conductor.

24. A method of forming a transistor, comprising:

forming a gate dielectric and a gate conductor above a surface of a semiconducting substrate;

forming a first plurality of sidewall spacers comprised of silicon germanium having a germanium concentration of greater than approximately 25% adjacent said gate dielectric and said gate conductor;

implanting said substrate with a dopant material to form a plurality of lightly-doped regions in said substrate adjacent said first plurality of sidewall spacers;

heating said substrate to drive said dopant material in said lightly-doped regions toward said gate dielectric;

removing said first plurality of sidewall spacers;

forming a second plurality of sidewall spacers adjacent said gate dielectric and said gate conductor; and implanting said substrate with a dopant material to form a plurality of heavily-doped regions in said substrate in an area adjacent said second plurality of sidewall spacers, said heavily-doped regions having a higher concentration of dopant material than said lightly-doped regions.

25. The method of claim 24, wherein forming a gate dielectric and a gate conductor above a surface of a semiconducting substrate comprises:

forming a layer of silicon dioxide above a surface of said substrate;

forming a layer of polysilicon above said layer of silicon dioxide; and patterning said layer of silicon dioxide and said layer of polysilicon.

26. The method of claim 24, wherein forming a first plurality of sidewall spacers adjacent said gate dielectric and said gate conductor comprises:

forming a layer of silicon germanium having a germanium concentration greater than approximately 25% at least above said gate conductor and said substrate;

implanting said layer of silicon germanium with a quantity of dopant material; and anisotropically etching said layer of silicon germanium to form a first plurality of sidewall spacers comprised of silicon germanium and said dopant material.

27. The method of claim 24, wherein forming a first plurality of sidewall spacers adjacent said gate dielectric and said gate conductor comprises:

forming a layer of silicon germanium having a germanium concentration greater than approximately 25% at least above said gate conductor and said substrate, said layer being formed in the presence of a dopant material; and anisotropically etching said layer of silicon germanium to form a first plurality of sidewall spacers comprised of silicon germanium and said dopant material.

28. The method of claim 24, wherein implanting said substrate with a dopant material to form a plurality of lightly-doped regions in said substrate adjacent said first plurality of sidewall spacers comprises implanting said substrate with a dopant material at a concentration ranging from approximately $4 \times 10^{15}141.0 \times 10^{16}$ ions/cm$^2$ and at an energy level ranging from approximately 2–10 keV to form a plurality of lightly-doped regions in said substrate adjacent said first plurality of sidewall spacers.

29. The method of claim 24, wherein heating said substrate to drive said dopant material toward said gate dielectric comprises heating said substrate to a temperature ranging from approximately 950–1100° C. to drive said dopant material toward said gate dielectric.

30. The method of claim 24, wherein removing said first plurality of sidewall spacers comprises performing a wet etching process.

31. The method of claim 24, wherein forming a second plurality of sidewall spacers adjacent said gate dielectric and said gate conductor comprises:

forming a process layer comprised of silicon dioxide, silicon nitride, or silicon oxynitride; and
anisotropically etching said process layer.

32. The method of claim 24, wherein implanting said substrate with a dopant material to form a plurality of heavily-doped regions in said substrate in an area adjacent said second plurality of sidewall spacers comprises implanting said substrate with a dopant material at a dopant concentration ranging from approximately $2.0$–$8.0 \times 10^{15}$ ions/cm$^2$ and at an energy level ranging from approximately 10–50 keV in an area adjacent said second plurality of sidewall spacers to form a plurality of heavily-doped regions in said substrate.

33. The method of claim 24, wherein forming a first plurality of sidewall spacers adjacent said gate dielectric and said gate conductor comprises forming a first plurality of sidewall spacers having a thickness ranging from approximately 150–400 Å adjacent said gate dielectric and said gate conductor.

* * * * *